(12) United States Patent
Macbeth et al.

(10) Patent No.: US 6,377,055 B1
(45) Date of Patent: *Apr. 23, 2002

(54) ARC FAULT DETECTOR DEVICE WITH TWO STAGE ARC SENSING

(75) Inventors: Bruce F. Macbeth; Thomas N. Packard, both of Syracuse, NY (US)

(73) Assignee: Pass & Seymour, Inc., Syracuse, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/464,163

(22) Filed: Dec. 16, 1999

Related U.S. Application Data

(60) Provisional application No. 60/112,827, filed on Dec. 18, 1998.

(51) Int. Cl.[7] ............................................. G01R 31/08
(52) U.S. Cl. ......................................... 324/522; 324/536
(58) Field of Search ............................... 324/522, 520, 324/521, 535, 536; 361/45, 43

(56) References Cited

U.S. PATENT DOCUMENTS

| 5,420,740 A | * | 5/1995 | MacKenzie et al. ........... 361/45 |
| 5,510,760 A | | 4/1996 | Marcou et al. ................. 335/8 |
| 5,594,358 A | | 1/1997 | Ishikawa et al. .............. 324/762 |
| 5,818,237 A | * | 12/1998 | Zuercher et al. ............. 324/536 |
| 5,969,921 A | * | 10/1999 | Wafer et al. .................. 361/45 |
| 6,031,699 A | * | 2/2000 | Dollar, II et al. ............. 361/42 |

* cited by examiner

Primary Examiner—Safet Metjahic
Assistant Examiner—T. R. Sundaram
(74) Attorney, Agent, or Firm—Wall Marjama & Bilinsk LLP

(57) ABSTRACT

An arc fault detector for detecting an arc fault in electric power lines includes a two stage arc sensor. The first stage is a current transformer designed for high sensitivity to arc faults but which may saturate and lose detection capability during arc currents at 75A and higher. The second arc fault sensor, which does not saturate, stage senses the voltage across the impedance of the primary of the current transformer, or senses the voltage across the resistance of a section of the load carrying bus which forms the connection through the detector device, or of both, during an arc fault.

12 Claims, 1 Drawing Sheet

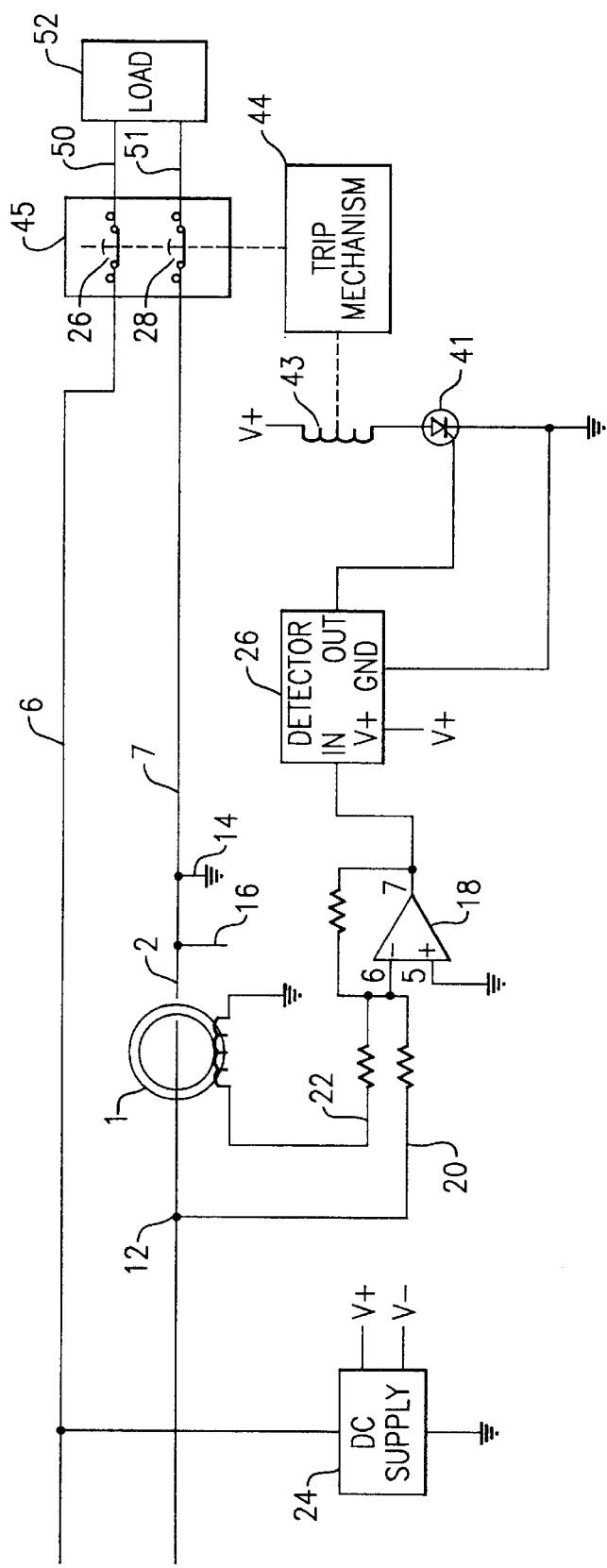

ARC FAULT DETECTOR DEVICE WITH TWO STAGE ARC SENSING

This application Claims benefit to U.S. provisional No. 60/112,827 filed Dec. 18, 1998.

FIELD OF THE INVENTION

This invention relates generally to an Arc Fault Detection device, and more particularly to an arc fault detection device comprising a two stage arc sensor. The first stage is a current transformer designed for high sensitivity but which may saturate during high level arc fault currents causing the loss of the secondary arc sense signal. The second arc fault sensor stage senses the voltage dropped across the impedance of the primary of the current transformer, or the voltage dropped across the resistance of a section of the load carrying bus which forms the power connection through the detector device, or the voltage drop across both.

BACKGROUND OF THE INVENTION

A percentage of fires each year are caused by electrical branch circuit line arcing which is of a duration, and at a level, which does not activate the thermal or magnetic trip elements in conventional circuit breakers in time to prevent a fire.

DESCRIPTION OF THE PRIOR ART

Arc detection is an enhancement to thermal magnetic overload detection typically used in circuit breakers, which alone may not detect and respond to arc faults. A number of devices for detecting arc faults and methods of detection have been used in the past. These include the use of E and B field arc sensors, detecting the amplitude of the rate of change of current signals when an arc fault occurs, the use of non-overlapping band pass filters to detect white noise characteristic of arcs, and detecting the disappearance of signals indicating the presence of arcs near zero current crossings. While some of these techniques are more or less effective, they require relatively sophisticated arc sensors and circuits. Heretofore, most arc detection circuits have been incorporated in circuit breakers.

There is a need for simple economical arc fault detectors that can be included in wiring devices such as receptacles, plugs or in-line devices, and that offer the same protection as an arc fault detector incorporated in a circuit breaker, but at lower cost. There is a need for an arc fault circuit detector in wiring devices that can be provided at a reduced cost compared with arc fault circuit detecting circuit breakers that is comparable to the reduction in cost between ground fault interrupting receptacles and ground fault interrupting circuit breakers.

This invention relates to an arc fault detector with a two stage arc sensor which permits a much smaller and less expensive current transformer sensor without sacrificing the detectors ability to respond to a broad range of arc fault currents. This allows a less expensive and smaller overall circuit which can be constructed to fit into a wiring sized device and which may also permit a dual purpose arc and ground fault detection circuit.

SUMMARY OF THE INVENTION

It is an object of this invention to provide an arc fault circuit interrupter that employs an electrical circuit that is simple enough, inexpensive enough and small enough to be included in wiring devices. It is another object of this invention to provide an arc fault circuit interrupter that is sensitive to relatively low amplitude series arc faults of at least 5 amps of arc current, typically in series with the load and commonly referred to as Type A arc faults.

It is another object of this invention to provide an arc fault circuit interrupter that detects parallel or line to line arcs, producing currents of 75 amps or more, commonly referred to as Type B arc faults.

Briefly stated, and in accordance with a presently preferred embodiment of the invention, an arc fault detector for detecting electric power lines includes a two stage arc sensor. The first stage is a current transformer designed for high sensitivity to arc faults but which may saturate and lose detection capability during arc currents at 75A and higher. The second arc fault sensor stage senses the voltage across the impedance of the primary of the current transformer, or senses the voltage across the resistance of a section of the load carrying bus which forms the connection through the detector device, or of both, during an arc fault, which does not saturate.

BRIEF DESCRIPTION OF THE DRAWINGS

The novel aspects of the invention are set forth with particularity in the appended claims. The invention itself, together with further objects and advantages thereof may be more readily comprehended by reference to the following detailed description of a presently preferred embodiment of the invention taken in conjunction with the accompanying drawing in which:

The drawing is a schematic diagram of the arc fault detector with two stage arc sensor.

FIG. 1 is a schematic diagram of the arc fault detector with two stage arc sensor.

DETAILED DESCRIPTION OF THE PREFERRED EMBODIMENT

Referring now to the drawing, an arc fault circuit interrupter of the present invention is illustrated in schematic form. The arc fault circuit interrupter shown in the drawing is formed from small inexpensive components that can be easily integrated into an electrical receptacle, plug, or in-line device. The circuit is designed so that it can be manufactured in the same form as the ground fault circuit interrupter devices shown in U.S. Pat. Nos. 5,594,358 and 5,510,760, for example.

The arc fault circuit interrupter of the drawing protects an electrical circuit including at least a neutral conductor 6 and a line conductor 7. A ground may also be present and the arc fault circuit interrupter of the drawing will detect arcs occurring between the line conductor and ground, the neutral conductor and ground, or the line and neutral conductors. A circuit interrupter 45 is connected in series with the line, between the power source and the load 52. A contactor or similar device may be employed, which includes a first set of contacts connected to the neutral conductor 6 and to the load by way of conductor 50, and a second set of contacts connected to the line conductor 7, and to the load by conductor 51. Preferably, the first and second contacts are spring loaded by a mouse trap type arrangement, controlled by trip mechanism 44. When the trip mechanism is activated, the spring loaded contacts are open and latch in an open condition until they are manually reset. A device of this type is per se well known, and is shown, for example, in U.S. Pat. No. 5,510,760.

In particular this embodiment incorporates a two stage arc sensor. The first sensor 1 is a current transformer which can be configured to respond to arc steps in current, or to the arc RF noise generated by the arc, or both. Sensor 1 may be designed of a physically small core, with a core type or number of secondary turns, which gives good sensitivity, but which may saturate and lose signal during arcs above a predetermined level. In order to detect arc currents above the predetermined level of sensor 1, a second sensor 2 is constructed of a section of the conductor which carries current through the detector from the line supply side to the contactor 45. This conductor section may be the wire that passes from node 12, to circuit ground reference 14, or any other section of the conductor, which has one end of the section connected to input 20 of summer amplifier 18 and the other end of the section connected to the circuit reference. If the section of conductor used for sensor 2 is part of the current transformer primary, then that section is included in the impedance of the primary winding. As an example, the conductor section between node 12 and circuit reference 14 constitutes the primary winding. The wire section from node 16 to node 14 would be only resistive. As an alternative, the section may include a bi-metallic element having a resistance thereacross. Summer amplifier 18 is a summing amplifier which sums the voltage produced at the secondary of transformer sensor 1, applied to the summer input 22 of summer amplifier 18, with the voltage detected across the predetermined section of conductor comprising sensor 2. With low level arc faults, such as those in series with the load, transformer sensor 1 produces most of the arc signal output with little arc signal contribution from the voltage across the conductor wire section sensor 2. At an intermediate arc current, both the secondary of sensor 1 and the voltage drop across the conductor section comprising sensor 1 will produce signal which is summed by amplifier 18. The phase of both sensor voltages is connected for primarily adding. For large arc currents, the predominate arc signal source is the voltage across the conductor section. When the amplitude and type of arc signal produced at the output of amplifier 18 is of the correct type, signal detector block 26 responds to the arc signal and activates SCR 41, which activates in turn, solenoid 43, mechanism 44, and contactor 45, which disconnects the arc fault. Block 24 shows the DC supply for the arc fault detector.

While the invention has been described with reference to preferred embodiments, it will be understood by those skilled in the art that various changes may be made and equivalents may be substituted for elements thereof without departing from the scope of the invention. In addition, many modifications may be made to adapt a particular situation of material to the teachings of the invention without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed:

1. An arc fault detector comprising:

a first sensor responsive to the rate of change of current with respect to time in a circuit being protected, said first sensor generating a first signal;

a second sensor responsive to the magnitude of current flowing in said circuit being protected, said second sensor generating a second signal; and a detector connected to the first sensor and the second sensor and responsive to the sum of the first signal and the second signal for generating an arc fault signal whenever the sum exceeds a preselected value;

in which the second sensor comprises a section of a line of a circuit being protected, having a resistance thereacross, for producing a voltage signal when an arc is present, and the detector is connected to receive the voltage signal from the section.

2. The arc fault detector of claim 1 in which the first sensor comprises a transformer.

3. The arc fault detector of claim 2 in which the transformer comprises a transformer having a line of the circuit being protected as a primary winding of the transformer.

4. The arc fault detector of claim 1 in which the detector comprises a summing amplifier connected to the first sensor and the second sensor.

5. The arc fault detector of claim 2 in which the transformer comprises a toroidal transformer.

6. The arc fault detector of claim 4 comprising a threshold detector connected to the summing amplifier.

7. The arc fault detector of claim 6 comprising a circuit interrupter connected to the threshold detector.

8. The arc fault detector of claim 1 comprising a first resistor connected in series with the first sensor, and a second resistor connected in series with the second sensor.

9. The arc fault detector of claim 2 in which the transformer comprises a saturable transformer, and the second sensor is responsive to currents above which saturation of the transformer occurs to produce a second signal of sufficient magnitude for producing an arc fault signal from the detector.

10. The arc fault detector of claim 2 in which the first sensor is responsive to arcs of sufficiently small magnitude for producing a signal of sufficient magnitude for producing an arc fault signal from the detector in the absence of a signal from the second sensor.

11. The arc fault detector of claim 1 in which the section of a line includes a bi-metallic element having a resistance thereacross.

12. The arc fault detector of claim 1 comprising a circuit interrupter connected to the detector.

* * * * *